United States Patent
Harms et al.

(10) Patent No.: US 7,205,845 B2
(45) Date of Patent: Apr. 17, 2007

(54) AMPLIFIER CIRCUIT FOR CONVERTING THE CURRENT SIGNAL FROM AN OPTICAL RECEIVING ELEMENT INTO A VOLTAGE SIGNAL

(75) Inventors: Torsten Harms, Kempen (DE); Stefan van Waasen, Sollentuna (SE)

(73) Assignee: Infineon Technologies Fiber Optics GmbH, Berlin (DE)

( * ) Notice: Subject to any disclaimer, the term of this patent is extended or adjusted under 35 U.S.C. 154(b) by 104 days.

(21) Appl. No.: 11/066,944

(22) Filed: Feb. 25, 2005

(65) Prior Publication Data

US 2006/0001493 A1    Jan. 5, 2006

Related U.S. Application Data

(60) Provisional application No. 60/585,308, filed on Jul. 2, 2004.

(51) Int. Cl.
*H03F 3/08* (2006.01)

(52) U.S. Cl. .................. 330/308; 330/86; 330/110

(58) Field of Classification Search ........... 330/308, 330/86, 110
See application file for complete search history.

(56) References Cited

U.S. PATENT DOCUMENTS

| | | | | |
|---|---|---|---|---|
| 4,540,952 A | * | 9/1985 | Williams | ............ 330/279 |
| 5,786,730 A | * | 7/1998 | Hadley | ............ 330/59 |
| 5,812,030 A | | 9/1998 | Inami et al. | |
| 6,084,478 A | * | 7/2000 | Mayampurath | ............ 330/308 |
| 6,140,878 A | * | 10/2000 | Masuta | ............ 330/308 |
| 6,307,433 B1 | | 10/2001 | Ikeda | |
| 6,593,810 B2 | * | 7/2003 | Yoon | ............ 330/69 |
| 6,897,731 B2 | * | 5/2005 | Zhang et al. | ............ 330/298 |
| 2005/0046482 A1 | | 3/2005 | Schrodinger | |

FOREIGN PATENT DOCUMENTS

DE          41 12 934 A1    10/1993

OTHER PUBLICATIONS

European Search Report in German, Patent No. EP 05090179.2.

* cited by examiner

*Primary Examiner*—Patricia Nguyen
(74) *Attorney, Agent, or Firm*—Eschweiler & Associates, LLC

(57) ABSTRACT

An amplifier circuit for converting the current signal from an optical receiving element into a voltage signal. The amplifier circuit includes a transimpedance amplifier having a differential amplifier and a feedback resistor, a first adjustable resistor which is connected in parallel with the feedback resistor and whose resistance value is defined by a first control signal, and a series circuit connected in parallel with the feedback resistor. The series circuit includes a first capacitor and a second adjustable resistor, whose resistance value is defined by a second control signal. The two adjustable resistors are preferably formed as MOS resistors and have the same control signal applied to them. The amplifier circuit permits the provision of a high dynamic range during the operation of a transimpedance amplifier.

20 Claims, 1 Drawing Sheet

AMPLIFIER CIRCUIT FOR CONVERTING THE CURRENT SIGNAL FROM AN OPTICAL RECEIVING ELEMENT INTO A VOLTAGE SIGNAL

RELATED APPLICATION

The present application claims priority of U.S. Patent Application Ser. No. 60/585,308 filed by Torsten Harms and Stefan van Waasen on Jul. 2, 2004.

FIELD OF THE INVENTION

The invention relates to an amplifier circuit for converting the current signal from an optical receiving element into a voltage signal, using a transimpedance amplifier. In particular, the invention relates to an amplifier circuit having a transimpedance amplifier, which provides a high dynamic range in converting a photocurrent into voltage values.

BACKGROUND OF THE INVENTION

For the purpose of receiving and regenerating optical signals after passage through a transmission path, digital optical receivers are known which comprise a receiver circuit, in which the optical signal is converted into an analog electrical signal, and a digital signal processing part, in which the analog signal is regenerated into a digital data signal with standardized amplitude and clock information. In the receiver circuit, the received optical signal is converted into a photocurrent by means of a photodiode and amplified in a preamplifier.

Modern optical receiver circuits have to satisfy high requirements with regard to their dynamic range. As a rule, in order to convert the photocurrent into voltage values, current-voltage converters, what are known as transimpedance amplifiers (TIA), are used. Here, the entire photocurrent flows via a feedback resistor and is present as a voltage at the output of the transimpedance amplifier.

In order to cover a desired dynamic range of a few 10 dB, it is known to connect an MOS transistor in parallel with the feedback resistor, said transistor being operated in triode mode and its gate voltage being regulated in accordance with the level of the input signal from the photodiode and the dynamic requirements. In this way, a linear resistance parallel to the feedback resistor is provided. Since the resultant total resistance value decreases because of the parallel connection of two resistors, the gain of the transimpedance amplifier also decreases. A lower gain is associated with a reduced stability and phase margin of the transimpedance amplifier and can lead to undesired oscillations.

It is also known, in order to avoid such oscillations and to maintain the stability, either to reduce the open-loop gain or else to connect a variable compensation capacitor in parallel with the nonreactive feedback resistor and the MOS transistor. The first alternative is generally not practical. With regard to the second alternative, in the prior art, solutions via a plurality of comparators and a plurality of reference voltages for these comparators are connected up step-by-step to compensation capacitors. This disadvantageously entails high expenditure on circuitry. In addition, the control behavior is discontinuous.

There is a need for an amplifier circuit for converting the current signal from an optical receiving element into a voltage signal, using a transimpedance amplifier, which provides a high dynamic range with simultaneous stability and a continuous control behavior.

SUMMARY OF THE INVENTION

The invention provides an amplifier circuit for converting the current signal from an optical receiving element into a voltage signal which has the following features: a transimpedance amplifier comprising a differential amplifier and a feedback resistor, a first adjustable resistor which is connected in parallel with the feedback resistor and whose resistance value is defined by a first control signal, and a series circuit connected in parallel with the feedback resistor, comprising a first capacitor and a second adjustable resistor, whose resistance value is defined by a second control signal.

The present invention is based on the idea of connecting, in parallel with an adjustable resistor which is already present and which is preferably formed as an MOS transistor, a series circuit comprising a capacitor and a further adjustable resistor, which is likewise formed as an MOS transistor. The series circuit of a capacitor and a resistor in the feedback path of the differential amplifier acts as a pole-zero compensation means (lag-lead compensation). The adjustable resistor of the series circuit in this case provides an additional phase rotation and improves the phase margin of the transimpedance amplifier.

The control signal that is already present is preferably used for adjusting the first adjustable resistor, in order also to drive the second adjustable resistor which is connected in series with the capacitor. Via the dimensioning of the capacitor and of the second adjustable resistor, the stability of the circuit is ensured over the entire dynamic range. If MOS transistors are used as adjustable resistors, the additional expenditure on circuitry and the use of power and area is minimal.

In a preferred refinement, provision is made for there to be a comparison device with two inputs and one output, a voltage signal being applied to one input which is equal to the average of the signal range of the signal present on the output of the transimpedance amplifier. A reference voltage value is applied to the other input. The output from the comparison device provides the control signal for the adjustable resistors.

The invention also relates to an optical receiver circuit comprising the following components: a photodiode which can be illuminated, a first amplifier circuit for converting the output signal from the photodiode that can be illuminated into a voltage signal, a photodiode that cannot be illuminated, which simulates the electrical behavior of the photodiode that can be illuminated when it is free of illumination, a second amplifier circuit for converting the output signal from the photodiode that cannot be illuminated into a voltage signal, a post-amplifier having a first input and a second input, the output signal from the first amplifier circuit being supplied to the first input and the output signal from the second amplifier circuit being supplied to the second input, a control device for regulating the output signal from the second amplifier circuit to the average of the signal range of the output signal from the first amplifier circuit, and a comparison device having two inputs and one output, a voltage signal being applied to one input which is equal to the average of the signal range of the output signal from the first amplifier circuit, and a reference voltage value being applied to the other input.

In this case, the amplifier circuits are configured as explained above. Thus, the first amplifier circuit comprises: a first transimpedance amplifier having a first differential amplifier and a first feedback resistor, a first adjustable resistor which is connected in parallel with the first feedback resistor and whose resistance value is defined by a control signal, and a series circuit connected in parallel with the first feedback resistor comprising a first capacitor and a second adjustable resistor, whose resistance value is likewise defined by the control signal.

The second amplifier circuit comprises: a second transimpedance amplifier having a second differential amplifier and a second feedback resistor, a third adjustable resistor which is connected in parallel with the second feedback resistor and whose resistance value is defined by the control signal, and a series circuit connected in parallel with the second feedback resistor comprising a second capacitor and a fourth adjustable resistor, whose resistance value is likewise defined by the control signal. In this case, the control signal for all the adjustable resistors is provided at the output of the comparison device.

BRIEF DESCRIPTION OF THE DRAWINGS

The invention will be described in more detail below with reference to the figures and by using an exemplary embodiment.

DESCRIPTION OF A PREFERRED EXEMPLARY EMBODIMENT

Figure 1:
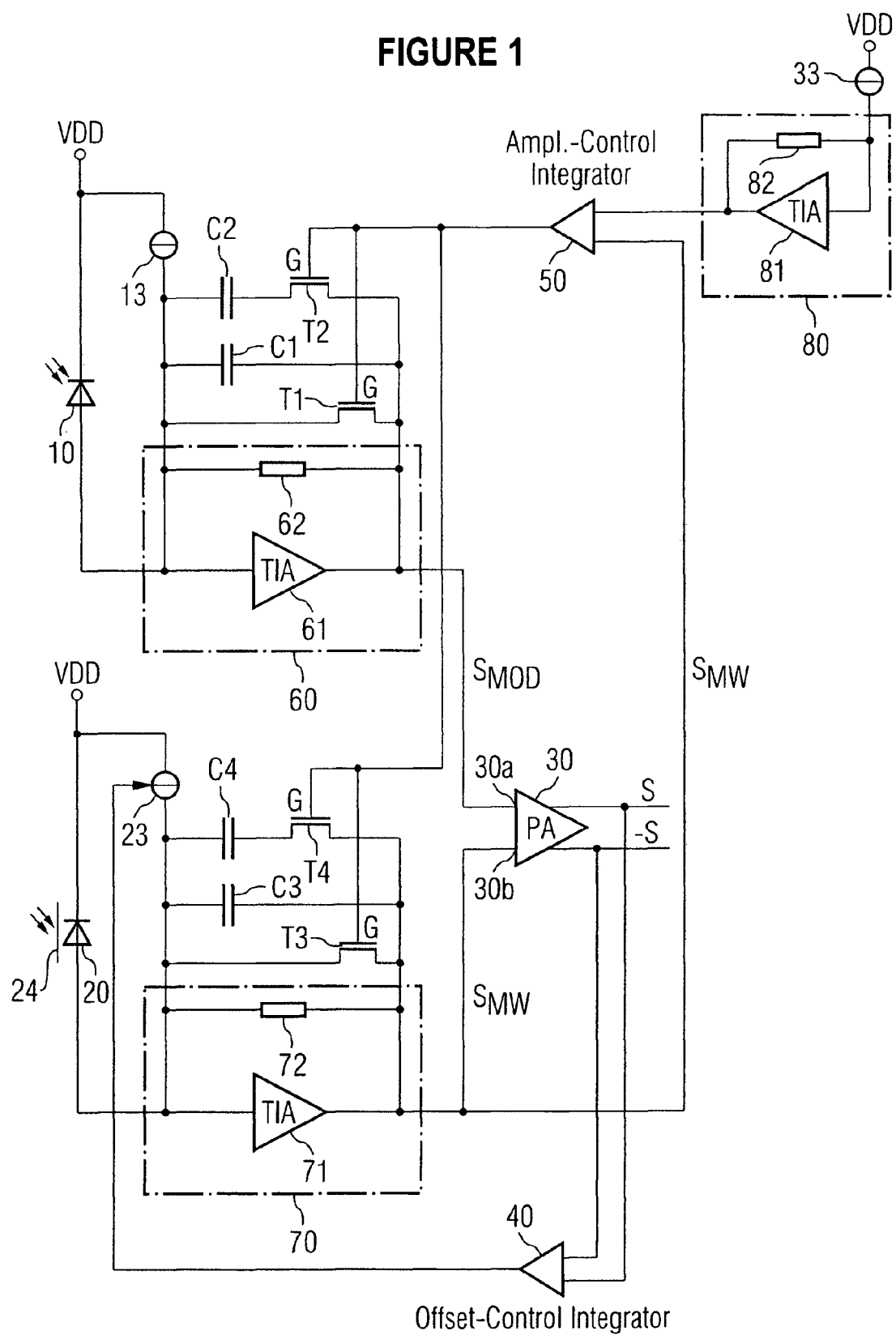
FIG. 1 shows an optical receiver circuit for converting an optical signal into an analog electrical signal.

FIG. 1 describes a circuit arrangement in which a first optical receiving element 10 in the form of a photodiode is provided, which converts an optical information signal into an electrical signal. The electrical signal is amplified in a preamplifier 60 and is supplied to the one input 30a of a post-amplifier 30, which is a differential amplifier. The preamplifier is a transimpedance amplifier 60, which comprises a voltage amplifier 61 and a feedback resistor 62. The substantially square-wave output signal from the photodiode 10 at the input of the transimpedance amplifier 60 has superimposed on it a constant current from a fixed current source 13, which provides a suitable offset at the input of the voltage amplifier 61.

A plurality of circuit elements are connected in parallel with the feedback resistor 62. A first circuit element connected in parallel with the feedback resistor 62 is a field effect transistor T1. A control signal provided by a comparison device 50, explained further in the following text, is applied to the gate terminal of the transistor T1. Via this control signal or the voltage on the gate terminal, a specific resistance of the transistor T1 is provided. The transistor T1 is in this case preferably operated in the triode range, so that there is a linear dependence between the applied voltage and the resistance.

Instead of a field effect transistor, in principle a bipolar transistor can also be used.

As a result of the provision of a further resistor T1 arranged in parallel with the feedback resistor 62, the total resistance in the feedback loop of the voltage amplifier 61 decreases. This leads to the gain of the transimpedance amplifier 60 decreasing overall.

A second circuit element which is connected in parallel with the feedback resistor 62 is a first capacitor C1. This capacitor C1 constitutes a compensation capacitor which is used to avoid oscillations in the event of a decreasing gain of the feedback resistor.

Thirdly, the series circuit comprising a second capacitor C2 and a second field effect transistor T2 is connected in parallel with the feedback resistor 62. The gate terminal of the second transistor T2 in this case has applied to it the same control voltage which is also applied to the gate terminal of the first transistor T1. Instead of the field effect transistor, once again a bipolar transistor can alternatively also be used. The field effect transistors T1, T2 are preferably formed as MOS transistors.

The series circuit of the elements C2, T2 connected in parallel with the feedback resistor 62 permits continuous adjustment of the compensation capacitance of the transimpedance amplifier, which is formed by the capacitors C1, C2. This is made possible with little expenditure on circuitry, since the control signal for the transistor T1 is used to control the voltage on the gate terminal of the transistor T1 connected in parallel with the capacitor C2. The compensation capacitance needed to ensure stability is provided by the further capacitor C2, which can be adjusted continuously via the controllable transistor T2. The adjustable resistor T2 in this case provides an additional phase rotation and improves the phase margin of the transimpedance amplifier 60.

A substantially identical further circuit part comprises a photodiode 20, a transimpedance amplifier 70 having a voltage amplifier 71 and a feedback resistor 72, a third field effect transistor T3, a third capacitor C3, and a further series circuit comprising a fourth capacitor C4 and a fourth field effect transistor T4. The gate terminals of the further transistors T3, T4 in this case have applied to them the same control signal which is also applied to the gate terminals of the transistors T1 and T2.

However, in this circuit part, the photodiode 20 is covered by a mask 24 or the like. This is a "dummy photodiode", which electrically simulates the electric behavior of the "seeing" photodiode 10 in the case in which it is free of illumination. In this way, high frequency interference can be suppressed to the greatest extent. A further difference is that the current source 23 is not constant, as in the case of the upper current source 13. Instead, this is a controllable current source, which receives a control signal from an offset control integrator 40, as will be explained further.

The output signal $S_{MOD}$ from the upper transimpedance amplifier 60 and the output signal $S_{MW}$ from the lower transimpedance amplifier 70 are supplied to the two inputs 30a, 30b of the post-amplifier 30. Since no optical signal is detected by the photodiode 20, the signal $S_{MW}$ applied to the input 30b has a constant value, apart from interfering frequencies. By contrast, the signal $S_{MOD}$ constitutes the square-wave-modulated information signal.

In order to correct the offset of the modulated signal $S_{MOD}$ output by the photodiode 10 and amplified in the transimpedance amplifier 60, the intention should be to feed into the lower input 30b of the post-amplifier 30 a "correction signal" $S_{MW}$ whose magnitude represents precisely 50% of the signal range of the signal $S_{MOD}$ at the other input 30a of the post-amplifier 30. At its output, the post-amplifier 30 provides an offset-corrected output signal S corresponding to the optical signal from the photodiode 10 and a signal −S inverted with respect thereto.

In order that the level $S_{MW}$ at the output of the transimpedance amplifier 21 is precisely equal to the average of the signal range of the data flow signal $S_{MOD}$, regulation is carried out. This is represented schematically by the offset control integrator 40. Depending on the differential output signal S, −S from the post-amplifier 30, the current source 23 is regulated in such a way that the signal $S_{MW}$ applied to the one input 30b of the post-amplifier 30 is precisely 50% of the signal range of the useful signal. For this case, two exactly mutually inverse signals S, −S are generated at the output of the post-amplifier 30. Otherwise, the output signal is distorted. The following components are driven differentially, that is to say the following components in each case evaluate the difference between two input signals. Since the signals are inverse in relation to each other, a double amplitude can be evaluated by the following components. This reduces the susceptibility to interference and increases the stability.

The receiver circuit has amplitude regulation for adjusting the amplitude of the information signal $S_{MOD}$ present at the output of the transimpedance amplifier 60. For this purpose, the constant output value in the lower transimpedance amplifier 70, which is at 50% of the signal range of the information signal $S_{MOD}$ at the output of the upper transimpedance amplifier 60, is compared with a reference value in a comparison device 50. The comparison device 50 is, for example, formed as an integrator. The reference value is provided via a further current source 33 and a further transimpedance amplifier 80 comprising elements 81, 82.

Depending on this comparison, a voltage signal is provided which is applied to the gate terminals of the transistors T1, T2 of the upper circuit part and to the gate terminals of the transistors T3, T4 of the lower circuit part. Via this voltage or control signal, firstly by means of the transistor T1 in the upper circuit part and by means of the transistor T3 in the lower circuit apart, the overall feedback resistance and therefore also the gain of the transimpedance amplifier 60, 70 is defined. At a low gain, secondly, continuous compensation for oscillations which occur is provided by the series circuits each comprising a capacitor C2, C4 and a further transistor T2, T4.

Via the control signal provided by the comparison device 50, the desired dynamic range of the receiver circuit can thus be adjusted. Via the dimensioning of the capacitor C2, C4 and the respective further field effect transistor T2, T4 in the series circuit, the stability of the gain can be ensured over the entire dynamic range. The additional expenditure on circuitry and the use of power and area are in this case minimal.

It is pointed out that the circuit device according to the invention with transimpedance amplifier has been described merely by way of example in the context of the receiver circuit of the figure. It can also be used in receiver circuits of different constructions.

The configuration of the invention is not restricted to the exemplary embodiments illustrated above. Those skilled in the art will recognize that there exist numerous alternative design variants which, in spite of their departure from the exemplary embodiments described, make use of the teaching defined in the following claims.

We claim:

1. An amplifier circuit for converting the current signal from an optical receiving element into a voltage signal, the amplifier circuit comprising:
   a transimpedance amplifier including:
      a differential amplifier, and
      a feedback resistor connected in parallel with the differential amplifier,
   a first substantially continuous adjustable resistor which is connected in parallel with the feedback resistor and whose resistance value is defined by a first control signal, and
   a series circuit connected in parallel with the feedback resistor, the series circuit comprising a first capacitor and a second substantially continuous adjustable resistor, whose resistance value is defined by a second control signal.

2. The circuit as claimed in claim 1, wherein the first substantially continuous adjustable resistor is a first field effect transistor, to whose gate terminal the first control signal is applied.

3. The circuit as claimed in claim 2, wherein the first field effect transistor is operated in the triode range.

4. The circuit as claimed in claim 1, wherein the second substantially continuous adjustable resistor is a second field effect transistor, to whose gate terminal the second control signal is applied.

5. The circuit as claimed in claim 4, the second field effect transistor being operated in the triode range.

6. The circuit as claimed in claim 1, a second capacitor also being provided, which is likewise connected in parallel with the feedback resistor.

7. The circuit as claimed in claim 1, wherein the first control signal and the second control signal are identical and originate from the same source.

8. The circuit as claimed in claim 7, wherein
   there is also a comparison device having two inputs and one output,
   to the one input a voltage signal is applied which is equal to the average of the signal range of the signal present at the output of the transimpedance amplifier,
   a reference voltage value being applied to the other input, and
   at whose output the control signal is provided.

9. An optical receiver circuit comprising:
   a first photodiode for generating a first output signal in response to an applied light signal;
   a first amplifier circuit for converting the first output signal from the photodiode into a first voltage signal;
   a second photodiode for simulating the electrical behavior of the first photodiode when the first photodiode is free of illumination;
   a second amplifier circuit for converting a second output signal from the second photodiode into a second voltage signal;
   a post-amplifier having a first input and a second input, the first voltage signal from the first amplifier circuit being supplied to the first input and the second voltage signal from the second amplifier circuit being supplied to the second input;
   a control device for regulating the second voltage signal from the second amplifier circuit to the average of the signal range of the first voltage signal from the first amplifier circuit, a third output signal from the post-amplifier being supplied to the control device as a controlled variable, and comprising
   a comparison device having two inputs and one output, a voltage signal being applied to one input which is equal to the average of the signal range of the first voltage signal from the first amplifier circuit, and a reference voltage value being applied to the other input,
   the first amplifier circuit comprising:
   a first transimpedance amplifier including:
   a first differential amplifier, and
   a feedback resistor,
   a first adjustable resistor which is connected in parallel with the first feedback resistor and whose resistance value is defined by a control signal, and
   a series circuit connected in parallel with the first feedback resistor, comprising a first capacity and a second adjustable resistor, whose resistance value is likewise defined by the control signal,
   the second amplifier circuit comprising:
   a second transimpedance amplifier comprising:

a second differential amplifier, and a second feedback resistor, a third adjustable resistor which is connected in parallel with the second feedback resistor and whose resistance value is defined by the control signal, and a series circuit connected in parallel with the second feedback resistor, comprising a second capacity and a fourth adjustable resistor, whose resistance value is likewise defined by the control signal, and the control signal for the adjustable resistors being provided at the output of the comparison device.

10. The receive circuit as claimed in claim 9, wherein the first adjustable resistor, the second adjustable resistor, the third adjustable resistor and the fourth adjustable resistor are in each case formed as a field effect transistor.

11. The receive circuit as claimed in claim 10, wherein the field effect transistors are each operated in the triode range.

12. The receiver circuit as claimed in claim 9, wherein the first amplifier circuit and the second amplifier circuit additionally have a further capacity in each case, which is connected in parallel with the feedback resistor.

13. The receiver circuit as claimed in claim 9, wherein the reference voltage value at the one input of the comparison device is provided by a further transimpedance amplifier.

14. An optical receiver circuit comprising:

an optical receiving element for generating a current signal in response to an applied optical signal;

a first amplifier circuit including:

a transimpedance amplifier including:

a voltage amplifier having an input terminal connected to receive the current signal generated by the optical receiving element, and a feedback resistor connected in parallel with the transimpedance amplifier, a first capacitor connected in parallel with the feedback resistor, a first substantially continuous adjustable resistor connected in parallel with the feedback resistor, and a series circuit connected in parallel with the feedback resistor, the series circuit including a second capacitor and a second substantially continuous adjustable resistor; and means for controlling the first and second substantially continuous adjustable resistors such that the first substantially continuous adjustable resistor has a first resistance value and the second substantially continuous adjustable resistor has a second resistance value, whereby a compensation capacitance of the transimpedance amplifier, which is produced by the first and second capacitors, is continuously adjusted to regulate an information signal generating by the first amplifier circuit at an output terminal of the voltage amplifier.

15. The optical receiver circuit according to claim 14, wherein the first substantially continuous adjustable resistor comprises a first field effect transistor having a first gate terminal, and the second substantially continuous adjustable resistor comprises a second field effect transistor having a second gate terminal that is electrically connected to the first gate terminal of the first field effect transistor.

16. The optical receiver circuit according to claim 14, further comprising:

a second amplifier circuit for generating a correction signal;

a post-amplifier having a first input terminal connected to receive the information signal generated by the first amplifier circuit, a second input terminal connected to receive a correction signal, and differential output terminals; and an offset control integrator connected between the differential output terminals of the post-amplifier and the second amplifier circuit for controlling the second amplifier circuit such that the control signal is 50% of a signal range of the information signal.

17. The circuit according to claim 1, wherein the first substantially continuous adjustable resistor is directly connected to an output of the differential amplifier.

18. The optical receiver circuit according to claim 14, wherein the first substantially continuous adjustable resistor is directly connected to an output of the differential amplifier.

19. An amplifier circuit for converting the current signal from an optical receiving element into a voltage signal, the amplifier circuit comprising:

a transimpedance amplifier including:

a differential amplifier, and a feedback resistor connected in parallel with the differential amplifier, a first adjustable resistor which is connected in parallel with the feedback resistor and whose resistance value is defined by a first control signal, and a series circuit connected in parallel with the feedback resistor, the series circuit comprising a first capacitor and a second adjustable resistor, whose resistance value is defined by a second control signal, wherein at least one of the first adjustable resistor or the second adjustable resistor is a field effect transistor operated in the triode range, to whose gate terminal the first control signal or second control signal is respectively applied.

20. An amplifier circuit for converting the current signal from an optical receiving element into a voltage signal, the amplifier circuit comprising:

a transimpedance amplifier including:

a differential amplifier, and a feedback resistor connected in parallel with the differential amplifier, a first adjustable resistor which is connected in parallel with the feedback resistor and whose resistance value is defined by a first control signal, and a series circuit connected in parallel with the feedback resistor, the series circuit comprising a first capacitor and a second adjustable resistor, whose resistance value is defined by a second control signal that is identical to and originates from the same source as the first control signal.

* * * * *